US012159686B2

(12) United States Patent
Sheridan

(10) Patent No.: US 12,159,686 B2
(45) Date of Patent: Dec. 3, 2024

(54) EARLY DETECTION OF COMPRESSION STATUS USING INLINE METADATA

(71) Applicant: Micron Technology, Inc., Boise, ID (US)

(72) Inventor: Patrick Michael Sheridan, Boulder, CO (US)

(73) Assignee: Micron Technology, Inc., Boise, ID (US)

( * ) Notice: Subject to any disclaimer, the term of this patent is extended or adjusted under 35 U.S.C. 154(b) by 200 days.

(21) Appl. No.: 17/865,102

(22) Filed: Jul. 14, 2022

(65) Prior Publication Data
US 2023/0101310 A1 Mar. 30, 2023

Related U.S. Application Data

(60) Provisional application No. 63/250,014, filed on Sep. 29, 2021.

(51) Int. Cl.
*G06F 3/06* (2006.01)
*G11C 7/10* (2006.01)

(52) U.S. Cl.
CPC .......... *G11C 7/1096* (2013.01); *G11C 7/1069* (2013.01); *G11C 7/109* (2013.01)

(58) Field of Classification Search
CPC .................................................... G06F 3/0608
USPC ........................................................ 711/171
See application file for complete search history.

(56) References Cited

U.S. PATENT DOCUMENTS

2010/0011150 A1* 1/2010 Klein ................... G06F 12/0246
711/E12.008
2015/0019813 A1* 1/2015 Loh ..................... G06F 12/0866
711/122
2015/0339228 A1   11/2015 Heddes et al.
2018/0076828 A1*  3/2018 Kanno ................... G11C 16/10
2018/0138921 A1   5/2018 Arelakis et al.
(Continued)

FOREIGN PATENT DOCUMENTS

CN        118020057 A     5/2024
WO        2023055459      4/2023

OTHER PUBLICATIONS

"International Application Serial No. PCT US2022 037162, International Search Report mailed Dec. 2, 2022", 3 pgs.
(Continued)

*Primary Examiner* — Hoai V Ho
(74) *Attorney, Agent, or Firm* — Schwegman Lundberg & Woessner, P.A.

(57) ABSTRACT

Disclosed in some examples are methods, systems, memory devices, and machine-readable mediums which store a single compressed value per line with a marker value in a front of the compressed version of the memory line. In some examples, the only value stored in the memory line is the value normally stored therein. This removes the complexity of the prediction tables and the inclusion of invalid values as well as preventing the penalty when those prediction tables are wrong. Furthermore, by inclusion of the marker in the beginning of the memory line, the system can quickly determine the compression status of the memory line without having to read the entire line. That is, it can quickly stop reading the rest of the memory line once the compressed data is read out which saves the memory device from having to read the entire line.

20 Claims, 8 Drawing Sheets

(56) References Cited

U.S. PATENT DOCUMENTS

| | | |
|---|---|---|
| 2018/0188996 A1 | 7/2018 | La Fratta et al. |
| 2019/0243780 A1 | 8/2019 | Gopal et al. |
| 2020/0336152 A1 | 10/2020 | Ahmed |
| 2020/0387495 A1 | 12/2020 | Pathak et al. |

OTHER PUBLICATIONS

"International Application Serial No. PCT US2022 037162, Written Opinion mailed Dec. 2, 2022", 4 pgs.

Young, Vinson, "Enabling Transparent Memory Compression for Commodity Memory Systems", 2019 IEEE International Symposium on High Performance Computer Architecture HPCA, (Feb. 2019), 12 pages.

"International Application Serial No. PCT/US2022/037162, International Preliminary Report on Patentability mailed Apr. 11, 2024", 6 pgs.

\* cited by examiner

| RoRaBaCoCh | ROW | BANK 0 | | | | BANK 1 | | | | BANK 2 | | | | BANK 3 | | | |
|---|---|---|---|---|---|---|---|---|---|---|---|---|---|---|---|---|---|
| | | A0 | A1 | B0 | B1 | C0 | C1 | D0 | D1 | E0 | E1 | F0 | F1 | G0 | G1 | H0 | H1 |
| UNCOMPRESSED | 0 | A0 | A1 | B0 | B1 | C0 | C1 | D0 | D1 | E0 | E1 | F0 | F1 | G0 | G1 | H0 | H1 |
| COMPRESSED | 1 | A.01 | AX | B.01 | BX | C.01 | CX | D.01 | DX | E.01 | EX | F.01 | FX | G.01 | GX | H.01 | HX |

610 — UNCOMPRESSED
612 — COMPRESSED
600 — DEVICE

| RoRaBaCoChBa | ROW | BANK 0 | | | | BANK 1 | | | | BANK 2 | | | | BANK 3 | | | |
|---|---|---|---|---|---|---|---|---|---|---|---|---|---|---|---|---|---|
| | | A0 | B0 | C0 | D0 | A1 | B1 | C1 | D1 | E0 | F0 | G0 | H0 | E1 | F1 | G1 | H1 |
| UNCOMPRESSED | 0 | A0 | B0 | C0 | D0 | A1 | B1 | C1 | D1 | E0 | F0 | G0 | H0 | E1 | F1 | G1 | H1 |
| COMPRESSED | 1 | A.01 | B.01 | C.01 | D.01 | AX | BX | CX | DX | E.01 | F.01 | G.01 | H.01 | EX | FX | GX | HX |
| COMPRESSED | 2 | MX | NX | OX | PX | I.01 | J.01 | K.01 | L.01 | IX | JX | KX | LX | M.01 | N.01 | O.01 | P.01 |

618 — UNCOMPRESSED
620 — COMPRESSED
622 — COMPRESSED
616 — DEVICE

*FIG. 6*

EARLY DETECTION OF COMPRESSION STATUS USING INLINE METADATA

PRIORITY APPLICATION

This application claims the benefit of U.S. Provisional Application Ser. No. 63/250,014, filed Sep. 29, 2021, which is hereby incorporated by reference in its entirety.

GOVERNMENT RIGHTS

This invention was made with U.S. Government support under Agreement No. DE-AC05-00OR22725, awarded by the U.S. Department of Energy. The U.S. Government has certain rights in the invention.

TECHNICAL FIELD

Embodiments pertain to memory devices. Some embodiments relate to compression of memory within memory devices.

BACKGROUND

Memory devices for computers or other electronic devices can be categorized as volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), static RAM (SRAM), erasable programmable ROM (EPROM), resistance variable memory, phase-change memory, storage class memory, resistive random-access memory (RRAM), and magnetoresistive random-access memory (MRAM), among others.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

FIG. 6 illustrates a first data placement scheme and a second data placement scheme of compressed and uncompressed data.

DETAILED DESCRIPTION

One bottleneck in memory device performance is the memory bandwidth and speed of interfaces between the memory cells and one or more other components, such as controllers or processors. Increasing this speed can be difficult to do as it can involve increasing a number of traces, increasing a clock speed at which the data is transferred, or other costly improvements. These solutions can be expensive as they can take up valuable room on a motherboard or other computing components, increase power consumption, or increase generated heat. Therefore, techniques for more efficiently utilizing existing interfaces are desirable, Most commonly, industry-standard interfaces to memory are used, such as, in the case of SDRAM DDR, memory devices and interfaces in accordance with JEDEC standards such as for DDR5, GDDR5, or LPDDR5; and/or with one or more standards for stacked DRAM modules, for example for high-bandwidth memory (such as HBM or HBM2).

One such technique for more efficiently utilizing the existing interfaces is compression. By compressing the data sent over the interface, fewer bits take up less space on the interface and more data can be sent simultaneously, at a given data rate. For example, by compressing data sent over the memory bus between the memory modules (e.g., DRAM DIMMs, stacked DRAM modules, etc.) and the memory controller in the processor (or another host), additional data can be sent over the memory bus per unit of time. To achieve this, the data is stored in memory in a compressed state and transferred over the interface in the compressed state. That is, a controller compresses the data and causes the compressed data to be transferred to the memory module and written. When the data is later read out, the compressed data is read out, sent across the interface to a controller and then decompressed. By sending smaller, compressed data, the interface to from the memory to the controller is used more efficiently.

Figure 2:
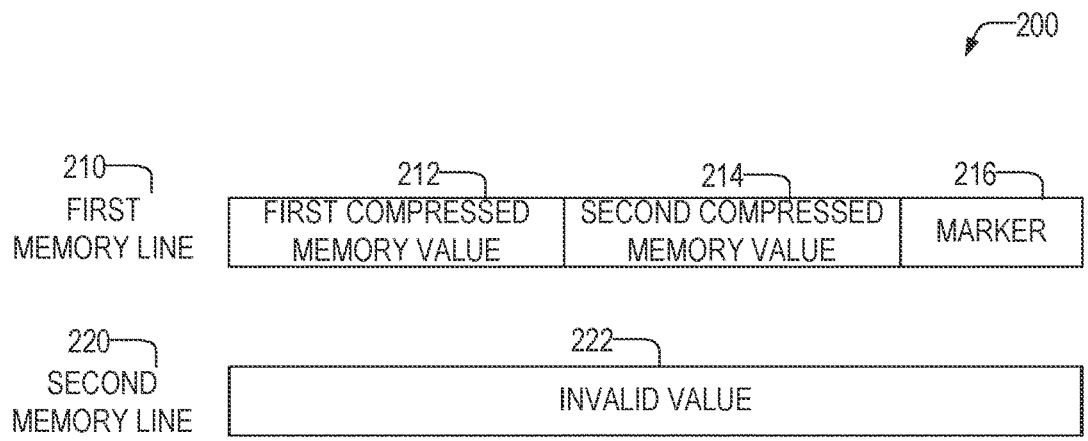
FIG. 2 illustrates a logical diagram of a memory organization with compression according to some examples.

In one previous technique, two lines of compressed data can be stored on a same memory line along with a marker indicating that the data is compressed. FIG. 2 illustrates an example logical diagram 200 of a memory organization with compression according to some examples. First memory line 210 stores first compressed memory value 212, second compressed memory value 214, and a marker 216. Second memory line 220 stores an invalid value 222.

To service a read or write request to the memory in such a system, the system must first determine where the value is stored and whether it is likely compressed or not. In some examples, a table is used to predict whether a particular memory value is compressed or not and where the value is likely to be found. In the example of FIG. 2, if a read comes in for the second value, the system first consults the table. If the table indicates that it is likely to be compressed, the table indicates that it is likely compressed, and it is likely in the first memory line 210. The memory device then goes to the first memory line 210, reads the entire memory line, and then determines if the marker is present at the end. The marker indicates if this memory line is compressed. If the marker is present, the table was correct and the value, in location 212, is decompressed, along with the second compressed value in location 214.

If the marker is not present, the table was wrong, and the system has to find the actual location of the second value and read it. That is, after having already read out the first memory line 210, the system must then go to the second memory line 220 and read it. In this case, the system will incur the penalty of reading two different memory lines to find one line. The table can also be wrong by indicating that the value is not compressed when the value is compressed. In this case, the system will proceed to wrongly read the second memory line 220. To deal with this situation, the system has placed a value indicating that the value is invalid and the value is compressed. Upon reading this invalid value, the system knows that the table was wrong and the value is compressed. The system must then go back to the first memory line 210 and read that memory line after having already read the second memory line 220.

Disclosed in some examples are methods, systems, memory devices, and machine-readable mediums which store a single compressed value per line with a marker value in a front of the compressed version of the memory line. In some examples, the only value stored in the memory line is the value normally stored therein. This removes the complexity of the prediction tables and the inclusion of invalid values as well as preventing the penalty when those prediction tables are wrong. Furthermore, by inclusion of the marker in the beginning of the memory line, the system can quickly determine the compression status of the memory line without having to read the entire line. That is, it can quickly stop reading the rest of the memory line once the compressed data is read out which saves the memory device from having to read the entire line.

In some examples, in addition to moving the marker to the front, the system can also split the compressed lines into portions and group the compressed line portions and the unused line portions (created due to the compression) into separate memory banks. That is, for a given row, a first bank can store compressed data and a second bank can store the empty space. To read the compressed data, only the first bank needs to be read. The second bank can be skipped. As the costliest part of reading the memory is activating the memory bank, this allows for accessing more of the consolidated values with a single activation. Similarly, the empty banks can be staggered across rows. For example, another row can store the compressed data in the second bank, and the blank space in the first bank. This allows for additional parallel access of the banks that can yield even more values—thus increasing the efficiency of the compression.

Figure 1:
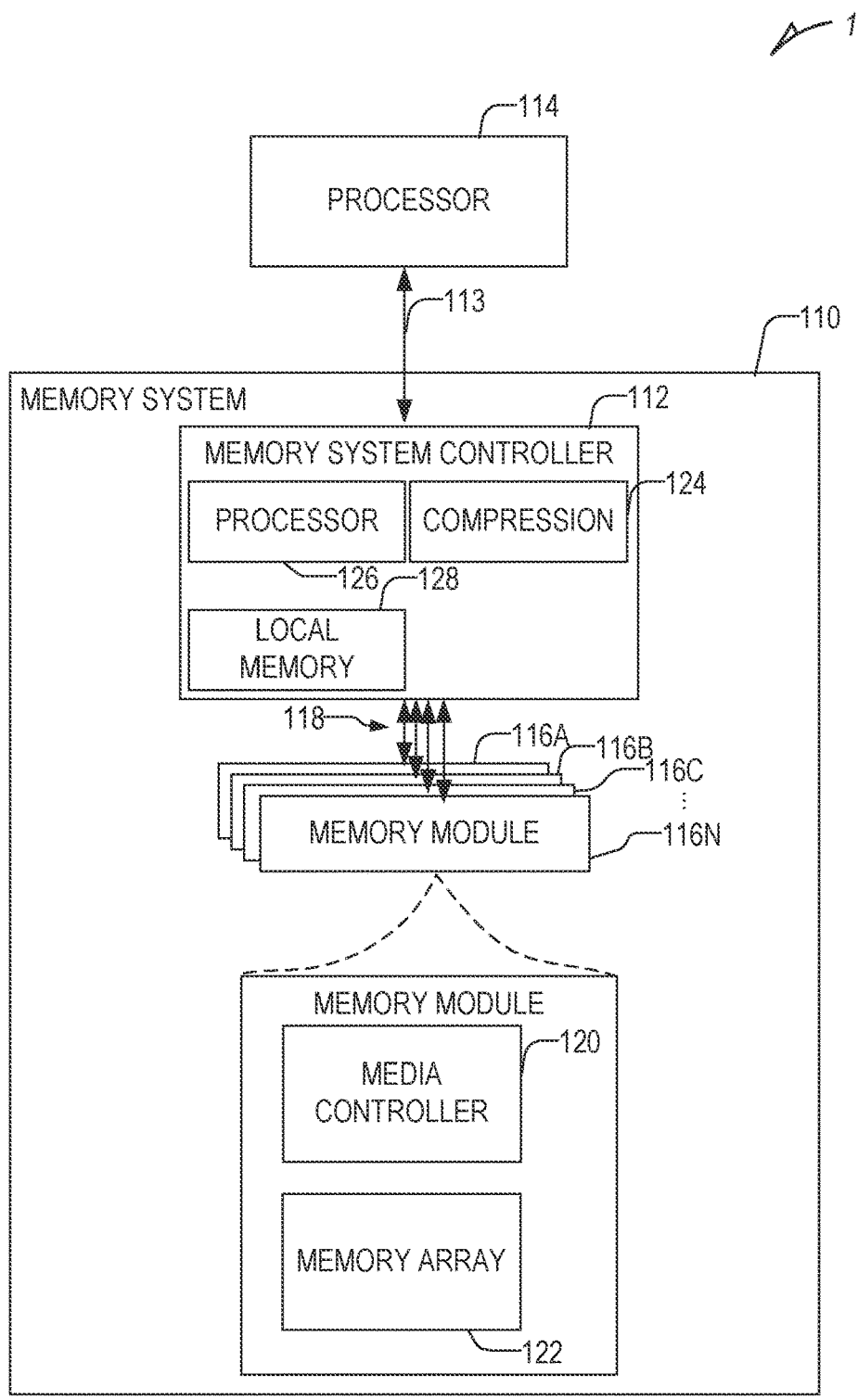
FIG. 1 illustrates an example computing environment including a memory system, in accordance with some examples of the present disclosure.

FIG. 1 illustrates an example computing environment 100 including a memory system 110, in accordance with some examples of the present disclosure. Memory system 110 can include volatile or non-volatile memory and can allow processor 114 to store and read data to and from the memory system 110. In some examples the memory system 110 can be a random-access memory (RAM) which is used by processor 114 to load and store instructions and other values. In some examples, the memory system 110 can be non-volatile storage device such as a solid-state drive (SSD), a Universal Flash Storage (UFS) device, an embedded Multi-Media Controller (eMMC) drive, a hard disk drive (HOD), or the like.

The memory system 110 can include a memory system controller 112. The memory system controller 112 can be coupled with processor 114. Processor 114 can include one or more processor cores. In some examples, processor 114 and memory system controller 112 can be on a same die. For example, on x86-based systems, the memory controller can be on a same die as one or more processor cores of processor 114. In other examples, memory system controller 112 can be on a separate die from the processor 114. In yet other examples, the memory system controller 112 can be on a same package as the processor cores, but a separate die. Memory system controller 112 and the processor 114 can be coupled over first interface 113.

In examples in which the memory system 110 is non-volatile storage, such as an SSD or UFS device, and in which the memory system controller 112 is not on the same die or package as the processor 114, the first interface 113 can be a Peripheral Component Interconnect-Express (PCIe) bus, a UFS bus, a serial advanced technology attachment (SATA) interface, a universal serial bus (USB) interface, a Fibre Channel, Serial Attached SCSI (SAS), an eMMC interface, or the like. In examples in which the memory system 110 is volatile RAM, and the memory system controller 112 is not on the same die or package as the processor 114, the first interface 113 can be a system bus or a front-side bus. In examples in which the memory system controller 112 is on a same die or package as the processor 114, the first interface 113 can be one or more traces, pins, or the like.

Memory modules such as modules 116A to 116N can be coupled to the memory system controller 112 over one or more internal or external second interfaces 118. In examples in which the memory system 110 is a volatile RAM system, and the memory system controller 112 is on a same die or package as the processor 114, the second interfaces 118 can be a system bus or front-side bus. In other examples, where the first interface 113 is the front-side bus or system bus, then the second interface 118 can be a memory bus. In examples in which the memory system 110 is non-volatile storage, such as a NAND device, the second interface 118 can be an internal memory bus.

The memory system 110 is shown, by way of example, to include the memory system controller 112 and media, such as memory modules 116A to 116N. The memory modules 116A to 116N can include any combination of the different types of volatile and/or non-volatile memory devices. In some examples, memory modules 116A to 116N can include random access memory (RAM), dynamic random-access memory (DRAM), such as in the form of or more Single Inline Memory Modules (SIMMS), Dual Inline Memory Modules (DIMMS) and the like; and/or as mentioned earlier herein, the memory modules can be any of various forms of stacked SDRAM die. In the case of such stacked SDRAM die, controller functionality implemented at least in part through control circuitry and related logic is often found on an associated die which in some examples, can be stacked with multiple SDRAM die, DIMMS can include control functionality, part of which can be present in a register clock driver (RCD) included on the memory module.

In some examples, memory modules 116A to 116N can include non-volatile memory devices such as not-and (NAND) type flash memory. Each of the memory modules 116A to 116N can include one or more memory arrays of memory cells such as single level cells (SLCs) or multi-level cells (MLCs) (e.g., triple level cells (TLCs) or quad-level cells (QLCs)). In yet other examples, the memory modules 116A to 116N can include phase change memory (PCM), magneto random access memory (MRAM), not-or (NOR) flash memory, electrically erasable programmable read-only memory (EEPROM), and/or a cross-point array of nor-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased.

Each of the memory cells of the memory array 122 can store bits of data (e.g., data blocks) used by the processor 114 or another component of a host system. Memory modules 116A-116N can include a separate media controller 120, a memory array 122, and other components. In some examples, the memory modules 116A-N can not include a media controller 120. Furthermore, the memory array 122 of the memory modules 116A-N can be grouped in one or more logical organizations. For volatile storage, one example logical organization groups memory cells by banks and rows. For nor-volatile storage, one example logical organization includes grouping cells into planes, sub-blocks, blocks, or pages.

The memory system 110 can include a memory system controller 112 with processor 126 and local memory 128. Memory system controller 112 can communicate with the memory modules 116A to 116N to perform operations such as reading data, writing data, or erasing data at the memory modules 116A to 116N and other such operations. The memory system controller 112 can include hardware such as one or more integrated circuits and/or discrete components, a buffer memory, or a combination thereof. The memory system controller 112 can be a microcontroller, special purpose logic circuitry (e.g., a field programmable gate array (FPGA), an application specific integrated circuit (ASIC), etc.), or other suitable processor. The memory system controller 112 can include a processor 126 (processing device) configured to execute instructions stored in a local memory. In the illustrated example, the local memory of the memory system controller 112 can include embedded memory 128 configured to store instructions for performing various processes, operations, logic flows, and routines that control operation of the memory system 110, including handling communications between the memory system 110 and the processor 114. In some embodiments, the local memory of the memory system controller 112 can include memory registers storing, e.g., memory pointers, fetched data, etc. The local memory can also include read-only memory (ROM) for storing micro-code.

In general, the memory system controller 112 can receive commands or operations from the processor 114 (or other component of a host) and can convert the commands or operations into instructions or appropriate commands to achieve the desired access to the memory modules 116A to 116N. The memory system controller 112 can be responsible for other operations such as wear leveling operations (e.g., garbage collection operations, reclamation), error detection and error-correcting code (ECC) operations, encryption operations, caching operations, block retirement, and address translations between a logical block address and a physical block address that are associated with the memory modules 116A to 116N. The memory system controller 112 can further include interface circuitry to communicate with the processor via the first interface 113. The interface circuitry can convert the commands received from the processor 114 into command instructions to access the memory modules 116A to 116N as well as convert responses associated with the memory modules 116A to 116N into information for the processor 114 or other component of the host system.

The memory system controller 112 can include a set of management tables to maintain various information associated with one or more components of the memory system 110. For example, the management tables can include information regarding block age, block erase count, error history, or one or more error counts (e.g., a write operation error count, a read bit error count, a read operation error count, an erase error count, etc.) for one or more blocks of memory cells coupled to the memory system controller 112.

Memory system controller 112 can include a compression component 124. In some examples, the compression component 124 can be implemented by the media controller 120. In some examples, compression component 124 can be implemented by the memory system controller 112. In some examples, the functions of media controller 120 can be performed by the memory system controller 112. Compression component 124 can compress memory written to the memory array 122, calculate a marker value, and append the marker value to the front of the compressed value for writing to the memory array 122. Compression component 124 can also provide one or more memory layouts. For example, compression component 124 can provide the compression layout of FIGS. 2, 3, and 6. Compression component 124 can perform the methods 400, 500, and 700. Compression component 124 can be implemented by processor 126 or can be one or more separate integrated circuits or can be implemented by both processor 126 in combination with one or more separate integrated circuits.

Memory modules 116A-116N can include a media controller 120 that can communicate with the memory modules 116A to 116N to receive commands from the memory system controller 112 and to perform operations such as reading data, writing data, or erasing data from the memory array 122. For example, the media controller 120 can parse a command and determine the affected memory cells from the memory array 122 and can read and/or write a desired value to those memory cells. Media controller 120 can be responsible for refreshing or otherwise maintaining the data stored in the memory array 122.

The media controller 120 can include hardware such as one or more integrated circuits and/or discrete components, a buffer memory, or a combination thereof. The media controller 120 can be a microcontroller, special purpose logic circuitry (e.g., a field programmable gate array (FPGA), an application specific integrated circuit (ASIC), etc.), or other suitable processor(s). The media controller 120 can include a processor (processing device) configured to execute instructions stored in a local memory. In the illustrated example, the local memory of the media controller 120 can include embedded memory configured to store instructions for performing various processes, operations, logic flows, and routines that control the memory array 122, including handling communications between the memory module 116A-116N and the memory system controller 112. In some embodiments, the local memory of the media controller 120 can include memory registers storing, e.g., memory pointers, fetched data, etc. The local memory can also include read-only memory (ROM) for storing micro-code. Media controller 120 can also include address circuitry, row decoders, I/O circuitry write circuitry, column decoders, sensing circuitry, and other latches for decoding addresses, writing to, and reading from the memory array 122.

Processor 114, as well as memory system 110 can be integrated into a host system. The host system can be a computing device such as a desktop computer, laptop computer, network server, mobile device, or such computing device that includes a memory and a processing device. The host system and/or the memory system 110 can be included in a variety of products, such as IoT devices (e.g., a refrigerator or other appliance, sensor, motor or actuator, mobile communication device, automobile, drone, etc.) to support processing, communications, or control of the product. The host system can include or be coupled to the processor 114 and to the memory system 110 so that the host system can read data from or write data to the memory system 110. As used herein, "coupled to" generally refers to a connection between components, which can be an indirect communicative connection or direct communicative connection (e.g., without intervening components), whether wired or wireless, including connections such as, electrical, optical, magnetic, and the like.

In an example, the memory system 110 can be a discrete memory and/or storage device component of a host system. In other examples, the memory system 110 can be a portion of an integrated circuit (e.g., system on a chip (SOC), etc.), stacked or otherwise included with one or more other components of a host system.

Figure 3:
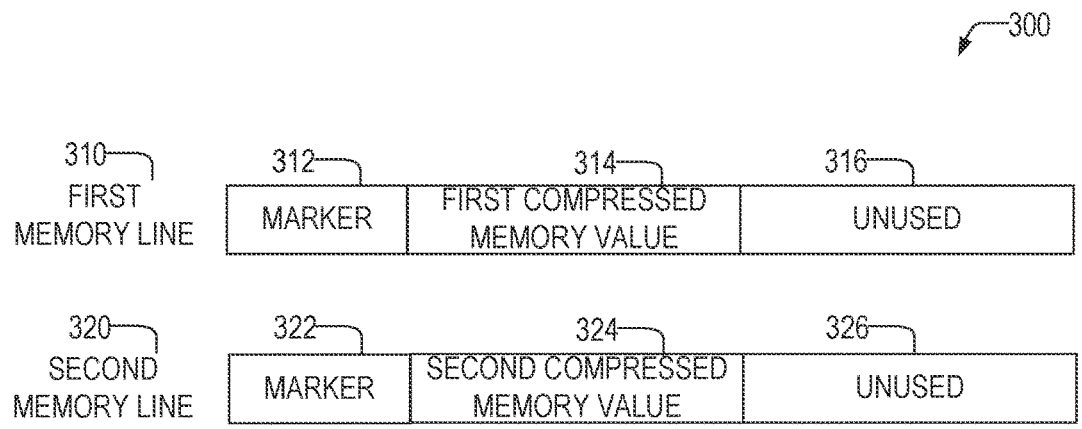
FIG. 3 illustrates a logical diagram of a memory organization with compression according to some examples.

As previously described, the disclosed techniques include a memory organization technique that efficiently allows for the compression of data in the memory system. FIG. 3 illustrates a logical diagram 300 of a memory organization with compression according to some examples of the present disclosure. First memory line 310 includes a marker 312 in the front; a first compressed value 314 and unused space 316. Similarly, second memory line 320 includes a marker 322 in the front, a second compressed memory value 324 and unused space 326. The first compressed value 314 can take up the entire first memory line 310 if it was not compressed. Likewise, the second compressed memory value 324 can take up the entire second memory line 320 if it were not compressed. Given the compression, there is generally unused space 316 and 326 along with space for marker 312 and 322. As previously noted, by placing the marker in the front, the system can stop reading once the compressed memory value is read out. In some examples, the compression is constant—that is, the compressed size, including the marker, is known. Thus, the system can read the marker; determine that the marker indicates that the value is compressed; and then read out only the number of bits of the compressed value—skipping reading out the unused space. For example, if the total memory line is 64 bytes, the compressed value can be up to 28 bytes (a 56.25% compression) and the marker can be 4 bytes, the system can read the first 4 bytes, determine that the data is compressed, and then only read the next 28 bytes. This saves on reading 32 bytes. For example, the system may always read a first portion of the memory line (e.g., such as a first half) whether its compressed or not. The marker gets read out first, then the remainder of the first half. At that point, the system is aware of whether the marker was contained in the first half and whether the system should continue reading additional portions (e.g., a second half).

Figure 4:
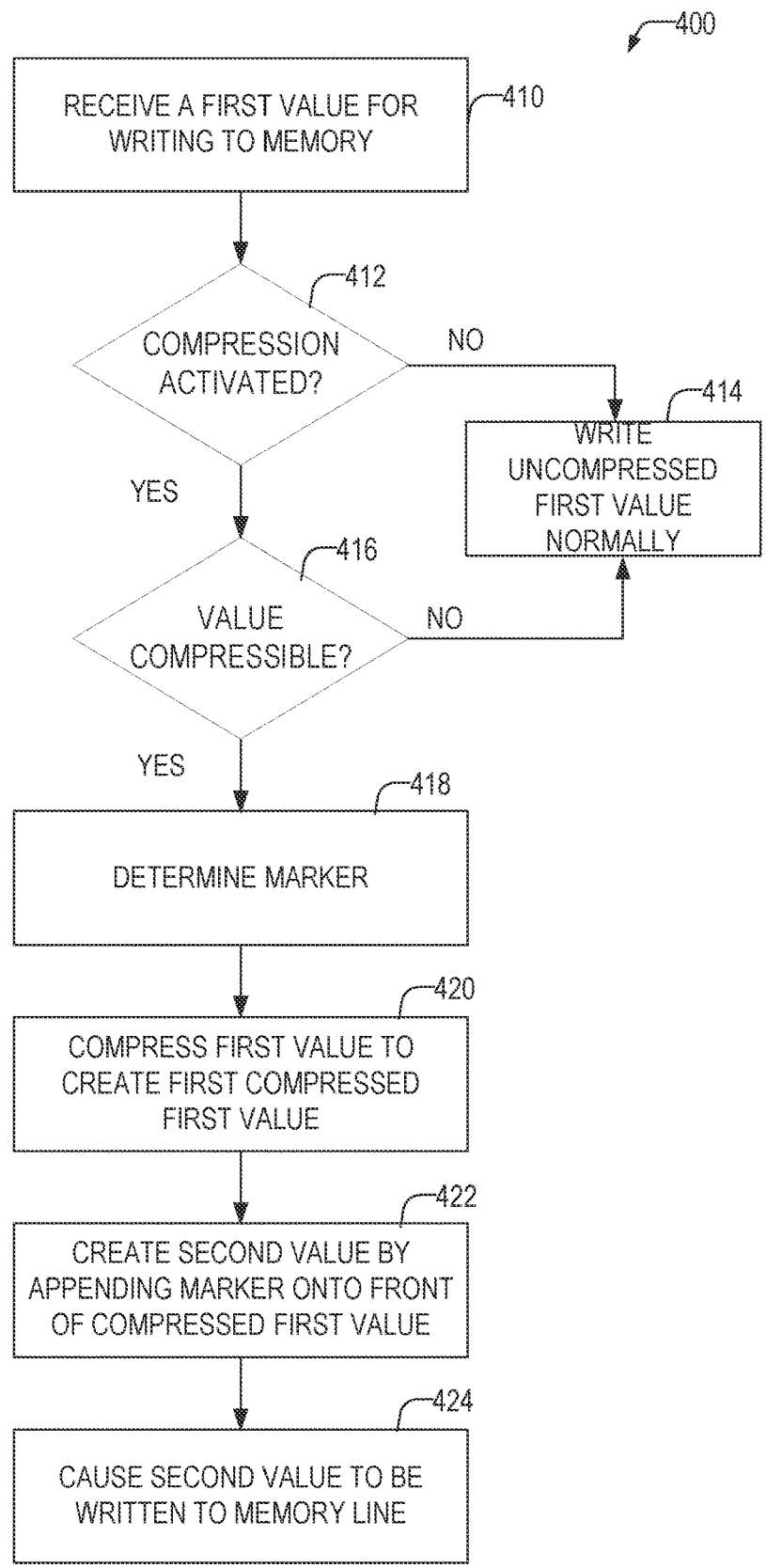
FIG. 4 illustrates a flowchart of a method of writing compressed data to memory according to some examples of the present disclosure.

FIG. 4 illustrates a flowchart of a method 400 of writing compressed data to memory according to some examples of the present disclosure. Method 400 can be performed by the memory system controller (e.g., memory system controller 112 of FIG. 1) or the media controller (e.g., media controller 120) or some operations can be performed by the memory system controller and some operations can be performed by the media controller. At operation 410 the memory system receives a first value for writing to the memory cells of the memory device. At operation 412, the system can determine whether memory compression is activated. For example, the memory device can be capable of operating in two modes, one in which values that are compressible are compressed and one in which no values are compressed. If compression is not activated then at 414, the uncompressed first value can be caused to be written normally in an uncompressed format.

At operation 416, if compression is activated, then a determination is made as to whether the value is compressible. For example, if the value is not compressible such that a marker can also be stored along with the compressed value, then the value can be incompressible. That is, if the value is such that compression does not yield more than a threshold level of space savings, the value can be considered incompressible. In other examples, the processor or other system can identify the value as not compressible. In some examples, some data values are not compressible by some compression schemes. Base-delta compression, for example, compresses values with low dynamic range but cannot compress values that exceed a specific range (e.g., it can compress 1, 2, 3, but not 1, 129, 258) into a given size. If the value is not compressible then at operation 414 the uncompressed first value is written normally to the memory.

At operation 418 the system can determine a marker that indicates that the value is compressed. For example, the marker can be a predetermined value. In other examples, the value can be calculated based upon the address of the memory line. In other examples, the value can be calculated based upon the address of the memory line, a global value, and/or other values. In some examples, the marker can be encrypted.

At operation 420, the first value can be compressed to create a compressed first value. Example compression techniques include base-delta, base-delta-immediate, dictionary-based, and the like. At operation 422, a second value is created by appending the marker determined at operation 418 onto the front of the compressed first value determined at operation 420. At operation 424, the system can cause the second value to be written to the memory line.

As used herein, a value is caused to be written to a memory line by sending a command to a media controller (e.g., such as media controller 120) to write the value, or, if the method is executed by the media controller, by causing the memory array to store the value.

Figure 5:
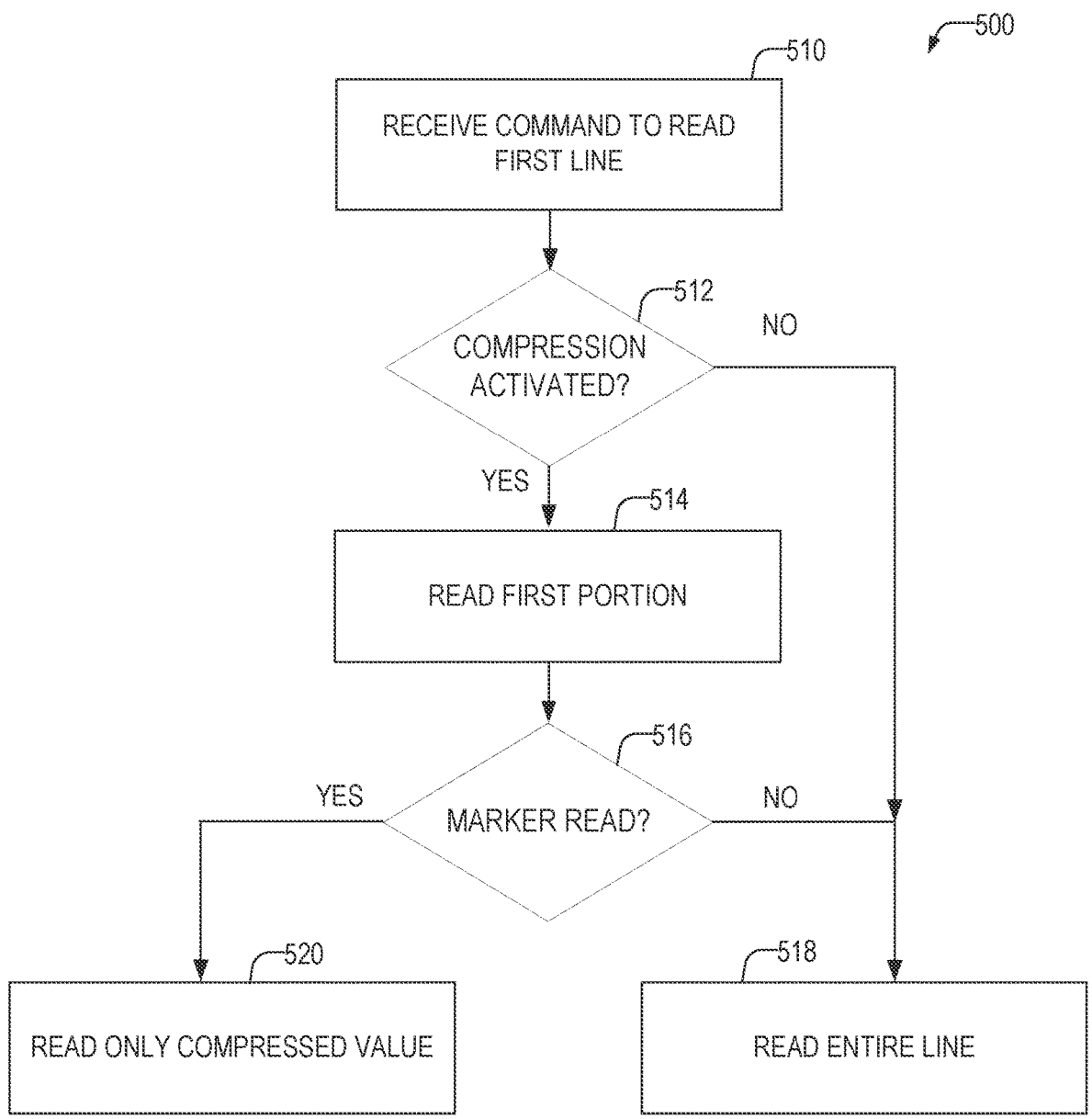
FIG. 5 illustrates a flowchart of a method for reading data from a memory.

FIG. 5 illustrates a flowchart of a method 500 for reading data from a memory. Method 500 can be performed by the memory system controller or the media controller or some operations can be performed by the memory system controller (e.g., memory system controller 112 of FIG. 1) and some operations can be performed by the media controller e.g., media controller 120 of FIG. 1). At operation 510 the system receives the command to read the first line. At operation 512 the system determines whether the compression feature is activated. If the feature is not activated, then the memory device operates normally and reads the entire memory line at operation 518.

If compression is activated, then at operation 514, a portion of the first line that is a size of the marker is read. At operation 516, it is determined if the portion read matches the expected marker. In some examples, the system can calculate the expected marker (e.g., by using the method described with respect to operation 418 of FIG. 4). If the data read from the first portion matches the expected marker, then at operation 520, the system can read only the compressed value following the marker. For example, a compressed value can have a particular size that corresponds to it. In other examples, the unused space can be indicated by one or more ending sequences such that the system reads the memory line until it encounters an ending sequence (e.g., a sequence of zeros, ones, or other values). If at operation 516, the marker is not read, or compression is not activated, then at operation 518 the system can read the entire line.

As can be appreciated, by placing the marker at the front of the memory line, the system can avoid reading the entire line and instead read only the compressed value. This can improve system performance.

In addition to placing the marker in the front of the memory line, other optimizations can be realized by the strategic placement of the compressed data. FIG. 6 illustrates a first data placement scheme 600 and a second data placement scheme 616 of compressed and uncompressed data. In the figure, Ro stands for Row, Ra stands for Rank, Ba stands for Bank, Co stands for column, and Ch stands for Channel (RoRaBaCoCh). Uncompressed data is shown placed on row 610. In contrast compressed data is shown in row 612. The memory device shown in FIG. 6 has four banks labeled 0-3. A.0 refers to the first half of memory line A, B.0 refers to the first half of memory line B, and so on. A.1 refers to the second half of memory line A, B.1 refers to the second half of memory line B, and so on. A.01 refers to the first and second half compressed memory line A (with the marker at the beginning); B.01 refers to first and second half compressed (with the marker at the beginning) memory line B; and so on. A.X refers to the unused half of memory line A, it remains unwritten; B.X refers to the unused half of memory line B, it remains unwritten; and so on.

As can be appreciated in the first data placement scheme 600, both A.0 and A.1 are written to consecutive portions in a same bank. That is, each bank can have two memory lines and both halves of the memory line are written to a single bank. Bank 0 has A.0, A.1, B.0, and B.1; Bank 1 has C.0, C.1, D.0, D.1; and so on. When the data is written in a compressed state, in the examples of FIG. 6, the data takes up half the space it normally would. This results in a first line of Bank 0 having the compressed version of both A.0 and A.1 (including the marker). The extra space gained is left empty and is represented by A.X. Similarly, B.0 and B.1 compress to B.01 and an unused portion B.X.

When memory is activated to access a particular bank, the values in a particular row are relatively inexpensive to read. That is, to read A.01, the entire row within bank 0 must be activated. Since reading A.X, B.01 and B.X is relatively cheap in terms of latency penalty, the system can be optimized to read additional data in parallel. As shown in second data placement scheme 616, the compressed line halves and unused line halves are each grouped together into separate banks. That is, the unused space is grouped into its own bank and the compressed line halves are grouped into their own bank. Additionally, the compressed line halves can be staggered across banks on different rows—that is, in a first row, a first bank can contain all compressed line halves and a second row can contain empty space. This optimization increases parallelism so that all banks are useful even if all data is compressible. Without staggering, all the valid groupings would land on Bank 0 and Bank 2, and Banks 1 and 3 would contain all invalid data. By staggering the grouping the banks can be read in parallel.

For example, the uncompressed storage row 618 shows the placement of the first half of lines A, B, C, and D in bank 0 with the other halves in Bank 1. Similarly, Bank 2 has the first halves of lines F, F, G, and H and the second halves in Bank 3. When compressed, as shown by row 620, each memory line half, now compressed, is stored in a same bank. Similarly, each unused half is stored in a same bank. That is, Bank 0 has A.01 (the combined compressed memory line halves A.0 and A.1); B.01 (the combined compressed memory line halves B.0 and B.1); C.01 (the combined compressed memory line halves C.0 and C.1); D.01 (the combined compressed memory line halves D.0 and D.1).

Bank 1, then has empty data created by the compression of A, B, C, and D. Banks 2 and 3 are similar to Bank 0 and 1 but for E, F, G, and H.

Because reading Bank 0 in the second data placement scheme 616 now allows for the memory device to read all of A, B, C, and D with one refresh operation, this potentially cuts the number of refreshes needed in half in comparison to first data placement scheme 600 which would require two refresh operations. In addition, if the system staggers the banks having no data and banks having the compressed values, the system can take advantage of increased parallelism by simultaneously reading different banks. As shown in row 622, the unused portion of M, N, O, and P are stored in bank 0 (where the compressed values of A, B, C, and D are stored in row 620), while the compressed first and second portions of M, N, O, and P are stored in Bank 3 (which stored the unused portions of E, F, G, and H). Thus, memory lines A-P can be read simultaneously. Banks 0-3 can be read simultaneously. That is, Bank 0 can be read to produce A-D, Bank 1 can be read to produce I-L, Bank 2 can be read to produce E-H, and Bank 3 can be read to produce M-P—all simultaneous to each other. As shown in FIG. 6, the system bifurcated the values in half. In other examples, other portions can be used, such as thirds, quarters, and the like.

Figure 7:
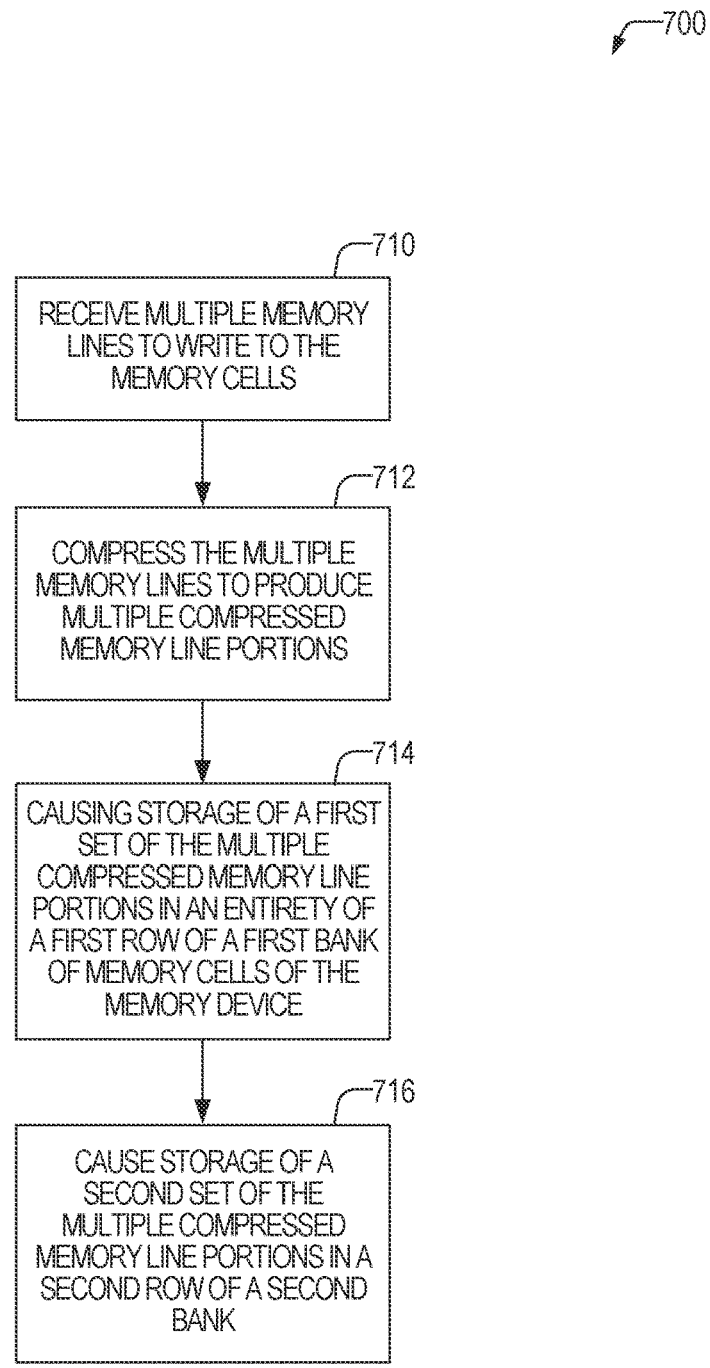
FIG. 7 illustrates a flowchart of a method of writing data to memory according to a data placement scheme according to some examples of the present disclosure.

FIG. 7 illustrates a flowchart of a method 700 of writing data to memory according to a data placement scheme according to some examples of the present disclosure. Method 700 can be performed by the memory system controller or the media controller or some operations can be performed by the memory system controller (e.g., memory system controller 112 of FIG. 1) and some operations can be performed by the media controller (e.g., media controller 120 of FIG. 1). At operation 710 the system can receive multiple memory lines for writing to memory cells of a memory device. The memory lines can be received at a same time or over a period of time.

At operation 712 the system can compress each of the multiple memory lines to produce multiple compressed memory line portions. For example, the data stored to be stored is now compressed into a smaller portion than the memory line. At operation 714, The system may cause storage of a first set of the multiple compressed memory line portions in an entirety of a first row of a first bank of memory cells of the memory device. In some examples, an entirety of the first row of the first bank is used to store compressed memory line portions and does not have any free space after the storage. In some examples, a first portion of free space created from the compression of the multiple memory lines causes an entirety of the first row of a second bank of memory cells of the memory device to be left empty.

At operation 714, the system may cause storage of a second set of the multiple compressed memory line portions in an entirety of a second row of the second bank. In some examples, an entirety of the second row of the second bank is used and does not have any free space after the storage. In some examples, a second portion of free space created from the compression of the multiple memory lines causes an entirety of the second row of the first bank to be left empty.

As noted previously, the placement of data in first and second banks can be selected to achieve the organization 616 shown in FIG. 6. For example, the first bank can be a bank that does not have an unused portion already stored in that row. Put differently either the row does not have any data in it already, or already has compressed portions in it. Second, the second bank can be a bank, different than the first, that does not have compressed portions in it. Furthermore, if the current row is X, the first bank can be selected so that the first bank for row X−1 or X+1 has unused portions. Similarly, if the current row is X, the second bank can be selected so that row X−1 or X+1 has portions storing compressed portions. The placement of the data may be defined in advance of the actual receipt and compression of the data through a selection of a data placement scheme or template.

As used herein a memory line is an addressable portion of memory of a specified size typically requested by a controller.

It should be noted that for ECC and parity data, the system may calculate the ECC and/or parity of only the written portion—e.g., the full line in the uncompressed case, or the half line in the compressed case. Since, in the compressed case, the unused portion of the line may contain random bits, the system does not calculate the ECC/parity information using the unused random bits.

Figure 8:
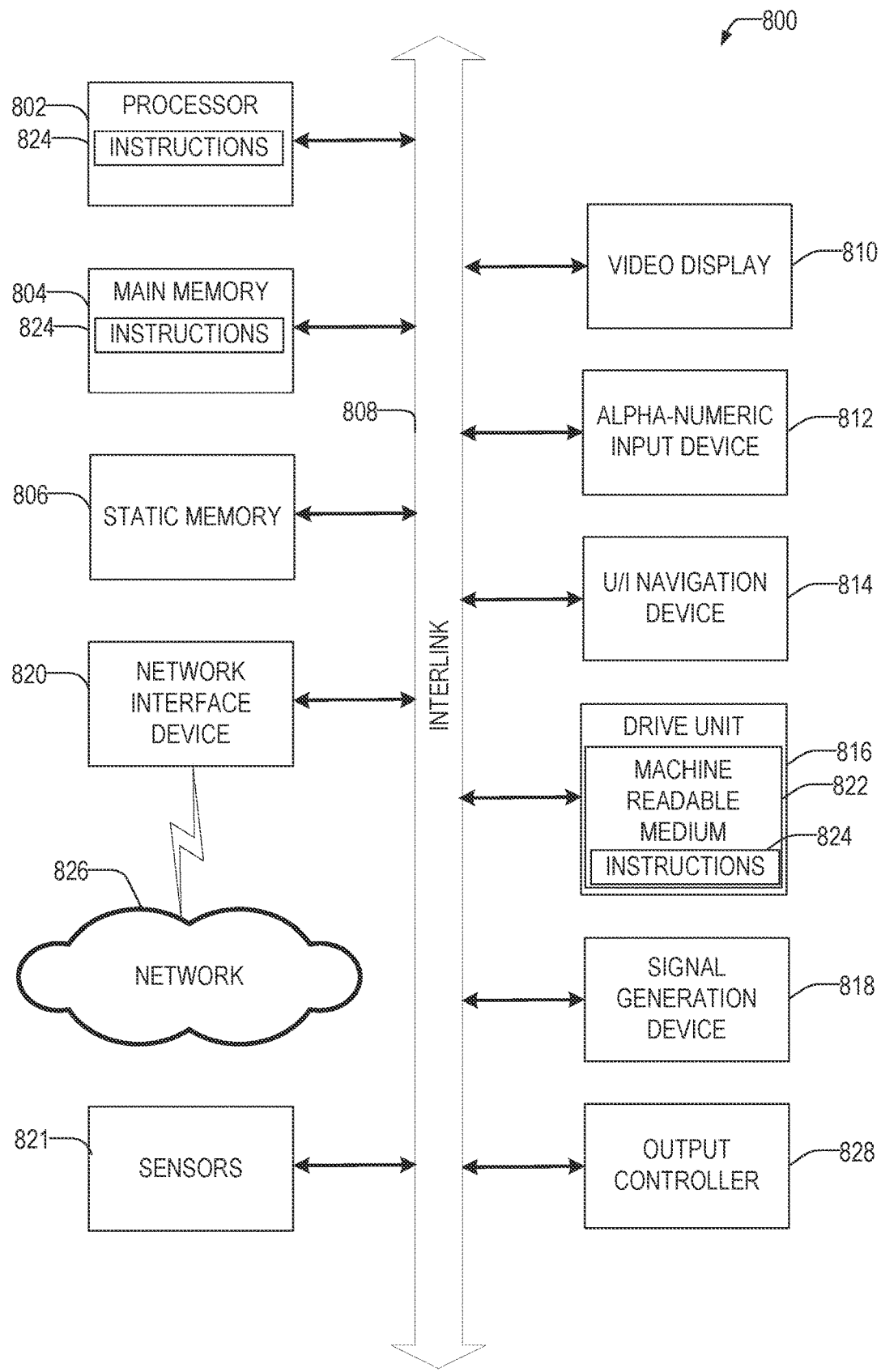
FIG. 8 is a block diagram illustrating an example of a machine upon which one or more embodiments can be implemented.

FIG. 8 illustrates a block diagram of an example machine 800 upon which any one or more of the techniques (e.g., methodologies) discussed herein can be performed. In alternative embodiments, the machine 800 can operate as a standalone device or can be connected (e.g., networked) to other machines. In a networked deployment, the machine 800 can operate in the capacity of a server machine, a client machine, or both in server-client network environments. In an example, the machine 800 can act as a peer machine in peer-to-peer (P2P) (or other distributed) network environment. The machine 800 can be in the form of a personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

In some examples, machine 800 can be a host device; main memory 804 can be an example of memory system 110; processor 802 can be an example of processor 114; and the like. In other examples, one or more components of machine 800, such as processor 802, can be part of one or more controllers, such as memory system controller 112, media controller 120, or the like. One or more components of machine 800 can be configured to implement the devices and/or methods of FIGS. 1-7.

Examples, as described herein, can include, or can operate on one or more logic units, components, or mechanisms (hereinafter "components"). Components are tangible entities (e.g., hardware) capable of performing specified operations and can be configured or arranged in a certain manner. In an example, circuits can be arranged (e.g., internally or with respect to external entities such as other circuits) in a specified manner as a component. In an example, the whole or part of one or more computer systems (e.g., a standalone, client or server computer system) or one or more hardware processors can be configured by firmware or software (e.g., instructions, an application portion, or an application) as a component that operates to perform specified operations. In an example, the software can reside on a machine readable medium. In an example, the software, when executed by the underlying hardware of the component, causes the hardware to perform the specified operations of the component.

Accordingly, the term "component" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which component are temporarily configured, each of the components need not be instantiated at any one moment in time. For example, where the components comprise a general-purpose hardware processor configured using software, the general-purpose hardware processor can be configured as respective different components at different times. Software can accordingly configure a hardware processor, for example, to constitute a particular module at one instance of time and to constitute a different component at a different instance of time.

Machine (e.g., computer system) 800 can include one or more hardware processors, such as processor 802, Processor 802 can be a central processing unit (CPU), a graphics processing unit (GPU), a hardware processor core, or any combination thereof. Machine 800 can include a main memory 804 and a static memory 806, some or all of which can communicate with each other via an interlink (e.g., bus) 808. Examples of main memory 804 can include Synchronous Dynamic Random-Access Memory (SDRAM), such as Double Data Rate memory, such as DDR4 or DDR5. Interlink 808 can be one or more different types of interlinks such that one or more components can be connected using a first type of interlink and one or more components can be connected using a second type of interlink. Example interlinks can include a memory bus, a peripheral component interconnect (PCI), a peripheral component interconnect express (PCIe) bus, a universal serial bus (USB), or the like.

The machine 800 can further include a display unit 810, an alphanumeric input device 812 (e.g., a keyboard), and a user interface (UI) navigation device 814 (e.g., a mouse). In an example, the display unit 810, input device 812 and UI navigation device 814 can be a touch screen display. The machine 800 can additionally include a storage device (e.g., drive unit) 816, a signal generation device 818 (e.g., a speaker), a network interface device 820, and one or more sensors 821, such as a global positioning system (GPS) sensor, compass, accelerometer, or other sensor. The machine 800 can include an output controller 828, such as a serial (e.g., universal serial bus (USB), parallel, or other wired or wireless (e.g., infrared(IR), near field communication (NFC), etc.) connection to communicate or control one or more peripheral devices (e.g., a printer, card reader, etc.).

The storage device 816 can include a machine readable medium 822 on which is stored one or more sets of data structures or instructions 824 (e.g., software) embodying or utilized by any one or more of the techniques or functions described herein. The instructions 824 can also reside, completely or at least partially, within the main memory 804, within static memory 806, or within the hardware processor 802 during execution thereof by the machine 800. In an example, one or any combination of the hardware processor 802, the main memory 804, the static memory 806, or the storage device 816 can constitute machine readable media.

While the machine readable medium 822 is illustrated as a single medium, the term "machine readable medium" can include a single medium or multiple media (e.g., a centralized or distributed database, and/or associated caches and servers) configured to store the one or more instructions 824.

The term "machine readable medium" can include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine readable medium examples can include solid-state memories, and optical and magnetic media. Specific examples of machine readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); Solid State Drives (SSD); and CD-ROM and DVD-ROM disks. In some examples, machine readable media can include non-transitory machine readable media. In some examples, machine readable media can include machine readable media that is not a transitory propagating signal.

The instructions 824 can further be transmitted or received over a communications network 826 using a transmission medium via the network interface device 820. The Machine 800 can communicate with one or more other machines wired or wirelessly utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks such as an Institute of Electrical and Electronics Engineers (IEEE) 802.11 family of standards known as Wi-Fi®, an IEEE 802.15.4 family of standards, a 5G New Radio (NR family of standards, a Long Term Evolution (LTE) family of standards, a Universal Mobile Telecommunications System (UMTS) family of standards, peer-to-peer (P2P) networks, among others. In an example, the network interface device 820 can include one or more physical jacks (e.g., Ethernet, coaxial, or phone jacks) or one or more antennas to connect to the communications network 826. In an example, the network interface device 820 can include a plurality of antennas to wirelessly communicate using at least one of single-input multiple-output (SIMO), multiple-input multiple-output (MIMO), or multiple-input single-output (MISO) techniques. In some examples, the network interface device 820 can wirelessly communicate using Multiple User MIMO techniques.

Other Notes and Examples

Example 1 is a method comprising: receiving a first value for writing to memory cells of a memory system; determining that the first value is compressible; responsive to determining that the first value is compressible, identifying a marker value, the marker value identifying the first value as compressed; compress the first value to create a first compressed value; creating a second value by appending the marker value to a front of the first compressed value; and causing the second value to be written to a line of memory cells of the memory system a remainder of the line of memory cells not written with another value.

In Example 2, the subject matter of Example 1 includes, receiving a command to read the first value from the memory cells; reading a first portion of the memory cells to read the marker value; identifying an expected marker value; determining that the marker value read from the first portion matches the expected marker value; and responsive to determining that the marker value read from the first portion matches the expected marker value, reading only the first compressed value and not an entire memory line.

In Example 3, the subject matter of Examples 1-2 includes, wherein a number of bits needed to store the first compressed value is fewer than a number of bits needed to store the first value.

In Example 4, the subject matter of Examples 1-3 includes, storing the second value in a first bank that does not already contain an unused portion for any other value previously written for a current row.

In Example 5, the subject matter of Example 4 includes, designating memory cells of a second bank for the current row as unused, the second bank not storing any compressed portion of any other value for the current row.

In Example 6, the subject matter of Example 5 includes, wherein the first bank is left unused for a second row, the second row being a previous or a next row to the current row.

In Example 7, the subject matter of Example 6 includes, wherein the second bank stores compressed portions in the second row.

In Example 8, the subject matter of Examples 1-7 includes, wherein identifying a marker value comprises identifying a prespecified value.

In Example 9, the subject matter of Examples 1-8 includes, wherein identifying a marker value comprises calculating the marker value based upon an address where the first value is written.

Example 10 is a memory system comprising: a memory controller configured to perform operations comprising: receiving a first value for writing to memory cells of the memory system; determining that the first value is compressible; responsive to determining that the first value is compressible, identifying a marker value, the marker value identifying the first value as compressed; compress the first value to create a first compressed value; creating a second value by appending the marker value to a front of the first compressed value; and causing the second value to be written to a line of memory cells of the memory system a remainder of the line of memory cells not written with another value.

In Example 11, the subject matter of Example 10 includes, receiving a command to read the first value from the memory cells; reading a first portion of the memory cells to read the marker value; identifying an expected marker value; determining that the marker value read from the first portion matches the expected marker value; and responsive to determining that the marker value read from the first portion matches the expected marker value, reading only the first compressed value and not an entire memory line.

In Example 12, the subject matter of Examples 10-11 includes, wherein a number of bits needed to store the first compressed value is fewer than a number of bits needed to store the first value.

In Example 13, the subject matter of Examples 10-42 includes, wherein the operations further comprise: storing the second value in a first bank that does not already contain an unused portion for any other value previously written for a current row.

In Example 14, the subject matter of Example 13 includes, wherein the operations further comprise: designating memory cells of a second bank for the current row as unused, the second bank not storing any compressed portion of any other value for the current row.

In Example 15, the subject matter of Example 14 includes, wherein the first bank is left unused for a second row, the second row being a previous or a next row to the current row.

In Example 16, the subject matter of Example 15 includes, wherein the second bank stores compressed portions in the second row.

In Example 17, the subject matter of Examples 10-46 includes, wherein identifying a marker value comprises identifying a prespecified value.

In Example 18, the subject matter of Examples 10-17 includes, wherein the operations of identifying a marker value comprises calculating the marker value based upon an address where the first value is written.

Example 19 is a non-transitory machine-readable medium, storing instructions, which when executed by a memory controller of a memory system, causes the memory controller to perform operations comprising: receiving a first value for writing to memory cells of the memory system; determining that the first value is compressible; responsive to determining that the first value is compressible, identifying a marker value, the marker value identifying the first value as compressed; compress the first value to create a first compressed value; creating a second value by appending the marker value to a front of the first compressed value; and causing the second value to be written to a line of memory cells of the memory system a remainder of the line of memory cells not written with another value.

In Example 20, the subject matter of Example 19 includes, receiving a command to read the first value from the memory cells; reading a first portion of the memory cells to read the marker value; identifying an expected marker value; determining that the marker value read from the first portion matches the expected marker value; and responsive to determining that the marker value read from the first portion matches the expected marker value, reading only the first compressed value and not an entire memory line.

In Example 21, the subject matter of Examples 19-20 includes, wherein a number of bits needed to store the first compressed value is fewer than a number of bits needed to store the first value.

In Example 22, the subject matter of Examples 19-21 includes, wherein the operations further comprise: storing the second value in a first bank that does not already contain an unused portion for any other value previously written for a current row.

In Example 23, the subject matter of Example 22 includes, wherein the operations further comprise: designating memory cells of a second bank for the current row as unused, the second bank not storing any compressed portion of any other value for the current row.

In Example 24, the subject matter of Example 23 includes, wherein the first bank is left unused for a second row, the second row being a previous or a next row to the current row.

In Example 25, the subject matter of Example 24 includes, wherein the second bank stores compressed portions in the second row.

In Example 26, the subject matter of Examples 19-25 includes, wherein identifying a marker value comprises identifying a prespecified value.

In Example 27, the subject matter of Examples 19-26 includes, wherein the operations of identifying a marker value comprises calculating the marker value based upon an address where the first value is written.

Example 28 is a method comprising: receiving multiple memory lines for writing to memory cells of a memory system; compressing each of the multiple memory lines to produce multiple compressed memory line portions; responsive to compressing each of the multiple memory lines to produce the multiple compressed memory line portions: causing storage of a first set of the multiple compressed memory line portions in an entirety of a first row of a first bank of memory cells of the memory system, an entirety of the first row of the first bank not having any free space after the storage, a first portion of free space created from the compression of the multiple memory lines causing an entirety of the first row of a second bank of memory cells of the memory system to be left empty; and causing storage of a second set of the multiple compressed memory line portions in an entirety of a second row of the second bank, an entirety of the second row of the second bank not having any free space after the storage, a second portion of free space created from the compression of the multiple memory lines causing an entirety of the second row of the first bank to be left empty.

In Example 29, the subject matter of Example 28 includes, reading the first and second sets of the multiple compressed memory line portions simultaneously.

In Example 30, the subject matter of Example 29 includes, decompressing the first and second sets of the multiple compressed memory line portions.

In Example 31, the subject matter of Examples 28-30 includes, wherein a marker is appended to a front of each of the multiple compressed memory line portions.

In Example 32, the subject matter of Example 31 includes, wherein the marker is a prespecified value.

In Example 33, the subject matter of Examples 31-32 includes, wherein the marker is based upon an address where each of the multiple compressed memory line portions are stored.

Example 34 is a memory system comprising: a memory controller configured to perform operations comprising: receiving multiple memory lines for writing to memory cells of the memory system; compressing each of the multiple memory lines to produce multiple compressed memory line portions; responsive to compressing each of the multiple memory lines to produce the multiple compressed memory line portions: causing storage of a first set of the multiple compressed memory line portions in an entirety of a first row of a first bank of memory cells of the memory system, an entirety of the first row of the first bank not having any free space after the storage, a first portion of free space created from the compression of the multiple memory lines causing an entirety of the first row of a second bank of memory cells of the memory system to be left empty; and causing storage of a second set of the multiple compressed memory line portions in an entirety of a second row of the second bank, an entirety of the second row of the second bank not having any free space after the storage, a second portion of free space created from the compression of the multiple memory lines causing an entirety of the second row of the first bank to be left empty.

In Example 35, the subject matter of Example 34 includes, wherein the operations further comprise reading the first and second sets of the multiple compressed memory line portions simultaneously.

In Example 36, the subject matter of Example 35 includes, wherein the operations further comprise decompressing the first and second sets of the multiple compressed memory line portions.

In Example 37, the subject matter of Examples 34-36 includes, wherein a marker is appended to a front of each of the multiple compressed memory line portions.

In Example 38, the subject matter of Example 37 includes, wherein the marker is a prespecified value.

In Example 39, the subject matter of Examples 37-38 includes, wherein the marker is based upon an address where each of the multiple compressed memory line portions are stored.

Example 40 is a non-transitory machine-readable medium, storing instructions, which when executed by a memory controller of a memory system, causes the memory controller to perform operations comprising: a memory controller configured to perform operations comprising: receiving multiple memory lines for writing to memory cells of the memory system; compressing each of the multiple memory lines to produce multiple compressed memory line portions; responsive to compressing each of the multiple memory lines to produce the multiple compressed memory line portions: causing storage of a first set of the multiple compressed memory line portions in an entirety of a first row of a first bank of memory cells of the memory system, an entirety of the first row of the first bank not having any free space after the storage, a first portion of free space created from the compression of the multiple memory lines causing an entirety of the first row of a second bank of memory cells of the memory system to be left empty; and causing storage of a second set of the multiple compressed memory line portions in an entirety of a second row of the second bank, an entirety of the second row of the second bank not having any free space after the storage, a second portion of free space created from the compression of the multiple memory lines causing an entirety of the second row of the first bank to be left empty.

In Example 41, the subject matter of Example 40 includes, wherein the operations further comprise reading the first and second sets of the multiple compressed memory line portions simultaneously.

In Example 42, the subject matter of Example 41 includes, wherein the operations further comprise decompressing the first and second sets of the multiple compressed memory line portions.

In Example 43, the subject matter of Examples 40-42 includes, wherein a marker is appended to a front of each of the multiple compressed memory line portions.

In Example 44, the subject matter of Example 43 includes, wherein the marker is a prespecified value.

In Example 45, the subject matter of Examples 43-44 includes, wherein the marker is based upon an address where each of the multiple compressed memory line portions are stored.

Example 46 is at least one machine-readable medium including instructions that, when executed by processing circuitry, cause the processing circuitry to perform operations to implement of any of Examples 1-45.

Example 47 is an apparatus comprising means to implement of any of Examples 1-45.

Example 48 is a system to implement of any of Examples 1-45.

Example 49 is a method to implement of any of Examples 1-45.

What is claimed is:

1. A method comprising:
   receiving a first value for writing to memory cells of a memory system;
   determining that the first value is compressible;
   responsive to determining that the first value is compressible, identifying a marker value, the marker value identifying the first value as compressed;
   compress the first value to create a first compressed value;
   creating a second value by appending the marker value to a front of the first compressed value; and
   causing the second value to be written to a line of memory cells of the memory system a remainder of the line of memory cells not written with another value.

2. The method of claim 1, further comprising:
   receiving a command to read the first value from the memory cells;
   reading a first portion of the memory cells to read the marker value;
   identifying an expected marker value;
   determining that the marker value read from the first portion matches the expected marker value; and
   responsive to determining that the marker value read from the first portion matches the expected marker value, reading only the first compressed value and not an entire memory line.

3. The method of claim 1, wherein a number of bits needed to store the first compressed value is fewer than a number of bits needed to store the first value.

4. The method of claim 1, further comprising:
   storing the second value in a first bank that does not already contain an unused portion for any other value previously written for a current row.

5. The method of claim 4, further comprising:
   designating memory cells of a second bank for the current row as unused, the second bank not storing any compressed portion of any other value for the current row.

6. The method of claim 5, wherein the first bank is left unused for a second row, the second row being a previous or a next row to the current row.

7. The method of claim 6, wherein the second bank stores compressed portions in the second row.

8. The method of claim 1, wherein identifying a marker value comprises identifying a prespecified value.

9. The method of claim 1, wherein identifying a marker value comprises calculating the marker value based upon an address where the first value is written.

10. A memory system comprising:
    a memory controller configured to perform operations comprising:
    receiving a first value for writing to memory cells of the memory system;
    determining that the first value is compressible;
    responsive to determining that the first value is compressible, identifying a marker value, the marker value identifying the first value as compressed;
    compress the first value to create a first compressed value;
    creating a second value by appending the marker value to a front of the first compressed value; and
    causing the second value to be written to a line of memory cells of the memory system a remainder of the line of memory cells not written with another value.

11. The memory system of claim 10, further comprising:
    receiving a command to read the first value from the memory cells;
    reading a first portion of the memory cells to read the marker value;
    identifying an expected marker value;
    determining that the marker value read from the first portion matches the expected marker value; and
    responsive to determining that the marker value read from the first portion matches the expected marker value, reading only the first compressed value and not an entire memory line.

12. The memory system of claim 10, wherein a number of bits needed to store the first compressed value is fewer than a number of bits needed to store the first value.

13. The memory system of claim 10, wherein the operations further comprise:
storing the second value in a first bank that does not already contain an unused portion for any other value previously written for a current row.

14. The memory system of claim 13, wherein the operations further comprise:
designating memory cells of a second bank for the current row as unused, the second bank not storing any compressed portion of any other value for the current row.

15. The memory system of claim 14, wherein the first bank is left unused for a second row, the second row being a previous or a next row to the current row.

16. The memory system of claim 15, wherein the second bank stores compressed portions in the second row.

17. The memory system of claim 10, wherein identifying a marker value comprises identifying a prespecified value.

18. The memory system of claim 10, wherein the operations of identifying a marker value comprises calculating the marker value based upon an address where the first value is written.

19. A non-transitory machine-readable medium, storing instructions, which when executed by a memory controller of a memory system, causes the memory controller to perform operations comprising:
receiving a first value for writing to memory cells of the memory system;
determining that the first value is compressible;
responsive to determining that the first value is compressible, identifying a marker value, the marker value identifying the first value as compressed;
compress the first value to create a first compressed value;
creating a second value by appending the marker value to a front of the first compressed value; and
causing the second value to be written to a line of memory cells of the memory system a remainder of the line of memory cells not written with another value.

20. The non-transitory machine-readable medium of claim 19, further comprising:
receiving a command to read the first value from the memory cells;
reading a first portion of the memory cells to read the marker value;
identifying an expected marker value;
determining that the marker value read from the first portion matches the expected marker value; and
responsive to determining that the marker value read from the first portion matches the expected marker value, reading only the first compressed value and not an entire memory line.

* * * * *